United States Patent
Ge

(10) Patent No.: US 11,894,457 B2
(45) Date of Patent: Feb. 6, 2024

(54) SEMICONDUCTOR DEVICE AND MANUFACTURING METHOD THEREOF

(71) Applicant: Joulwatt Technology Co., Ltd., Hangzhou (CN)

(72) Inventor: Weiwei Ge, Hangzhou (CN)

(73) Assignee: JOULWATT TECHNOLOGY CO., LTD., Hangzhou (CN)

(*) Notice: Subject to any disclaimer, the term of this patent is extended or adjusted under 35 U.S.C. 154(b) by 0 days.

(21) Appl. No.: 17/315,353

(22) Filed: May 9, 2021

(65) Prior Publication Data

US 2021/0351296 A1 Nov. 11, 2021

(30) Foreign Application Priority Data

May 9, 2020 (CN) .......................... 202010386746.6
May 13, 2020 (CN) .......................... 202010403207.9

(51) Int. Cl.
*H01L 29/78* (2006.01)
*H01L 29/08* (2006.01)
(Continued)

(52) U.S. Cl.
CPC ...... *H01L 29/7825* (2013.01); *H01L 29/0865* (2013.01); *H01L 29/1095* (2013.01); *H01L 29/66704* (2013.01)

(58) Field of Classification Search
CPC ... H01L 29/7816–7826; H01L 29/7834; H01L 29/7835; H01L 29/78618;
(Continued)

(56) References Cited

U.S. PATENT DOCUMENTS 7,888,732 B2 * 2/2011 Denison ............ H01L 29/66704
257/330
9,620,638 B1 * 4/2017 Luo ...................... H01L 29/7816
(Continued)

FOREIGN PATENT DOCUMENTS

CN 101154598 4/2008
CN 102227000 10/2011
(Continued)

OTHER PUBLICATIONS

Ge et al., HK SOI LDMOS device with three gate structures, Machine translation of CN-106024858-A, 2016, pp. 1-4. (Year: 2016).*

(Continued)

*Primary Examiner* — Natalia A Gondarenko
(74) *Attorney, Agent, or Firm* — Treasure IP Group, LLC

(57) ABSTRACT

Disclosed is a semiconductor device and a method for manufacturing the same. The semiconductor device comprises a drift region on a substrate, a well region on the drift region, a source-end doped region in the well region, a drain-end doped region on the drift region, and a gate structure which is located between a source end and a drain end, located at a position of the well region, and forms a channel region in the well region. The source-end doped region comprises a first doped region and a second doped region with opposite doping types, the channel region connects the first doped region and the drift region. The first doped region and the second doped region of the source end are equivalently close to the gate structure, a distance between the second doped region and a PN junction surface formed by the drift region and the well region is reduced.

16 Claims, 9 Drawing Sheets

(51) Int. Cl.
*H01L 29/66* (2006.01)
*H01L 29/10* (2006.01)

(58) Field of Classification Search
CPC . H01L 29/78651; H01L 29/0852–0886; H01L 29/1025; H01L 29/1095; H01L 29/66681–66704; H01L 29/0696; H01L 29/7831
USPC ....... 257/328, 330, 331, 332, 334, 488, 408, 257/29.001, 29.118
See application file for complete search history.

(56) References Cited

U.S. PATENT DOCUMENTS

| | | | |
|---|---|---|---|
| 9,870,925 B1 | 1/2018 | Feygenson | |
| 2020/0020775 A1* | 1/2020 | Ni | ................. H01L 29/0865 |

FOREIGN PATENT DOCUMENTS

| | | | | |
|---|---|---|---|---|
| CN | 102403224 | | 4/2012 | |
| CN | 102832249 | | 12/2012 | |
| CN | 104810245 | | 7/2015 | |
| CN | 106024858 | | 10/2016 | |
| CN | 106024858 A | * | 10/2016 | ......... H01L 29/0684 |
| CN | 106024897 | | 10/2016 | |
| CN | 107887447 | | 4/2018 | |
| CN | 110416283 | | 11/2019 | |
| JP | 2009170468 A | * | 7/2009 | ......... H01L 29/0696 |
| JP | 2010062262 | | 3/2010 | |
| TW | 200425388 | | 11/2004 | |

OTHER PUBLICATIONS

Adan, MOS field-effect transistor, 2009, machine translation of JP 2009170468 A, pp. 1-5. (Year: 2009).*

* cited by examiner

SEMICONDUCTOR DEVICE AND MANUFACTURING METHOD THEREOF

CROSS-REFERENCE TO RELATED APPLICATIONS

The present application claims the priority of Chinese Patent Application No. 202010403207.9, filed on May 13, 2020 and entitled by "SEMICONDUCTOR DEVICE", and the priority of Chinese Patent Application No. 202010386746.6, filed on May 9, 2020 and entitled by "SEMICONDUCTOR DEVICE AND MANUFACTURING METHOD THEREOF", which are incorporated herein by reference in its entirety.

FIELD OF TECHNOLOGY

The present disclosure relates to a technical field of semiconductors, in particular to a semiconductor device and a manufacturing method of the semiconductor device.

BACKGROUND

A Power LDMOS (Laterally-Diffused Metal-Oxide Semiconductor) is usually used in a case of high current and high voltage. An N-type LDMOS device generally includes an N+ doped drain region, an N-type drift region, a P-type well region, an N+ doped source region and a P+ doped body contact region, wherein the N+ doped source region and the P+ doped body contact region are located in the P-type well region. When the N-type LDMOS device is operated in a reverse voltage-withstanding state, a large number of electron-hole pairs are generated due to collision ionization, and then a corresponding hole current is generated. When the hole current flows from the P-type well region (p-body) to the P+ body contact region, the voltage drop on the P-type well region can be raised, which may lead to a parasitic NPN structure (formed by the N+ source region, the P-type well region and the N-type drift region) being mistakenly turned on, thus resulting in a functional failure of the device. The more holes generated by collision ionization in the device, the easier it is for the parasitic NPN structure to be mistakenly turned on. Therefore, a higher self-protection capability of the device is required.

SUMMARY

In view of the above problems, an objective of the present disclosure is to provide a semiconductor device and a manufacturing method of a semiconductor device, thereby improving the self-protection capability of the device.

According to an aspect of the present disclosure, there is provided a semiconductor device, comprising: a substrate; a drift region, located on the substrate; a drain-end doped region, located at one end of an upper surface of the drift region in a first direction; a well region, located at another end of the upper surface of the drift region, wherein said another end is opposite to the drain-end doped region in the first direction; a source-end doped region, located in the well region; a gate structure, which is located at the well region, and forms a channel region at a position from the well region to the drift region, wherein a channel direction of the channel region is the first direction of the drift region, wherein the channel region is located between the source-end doped region and the drain-end doped region, and is in contact with the source-end doped region; wherein, the source-end doped region comprises at least one first doped region and at least one second doped region of opposite doping types, a doping type of the drift region is same with a doping type of the drain-end doped region, a doping type of said at least one first doped region is same with the doping type of the drain-end doped region, said at least one first doped region and said at least one second doped region are linearly distributed in a second direction and alternately connected, wherein the second direction is perpendicular to the first direction on the upper surface of the drift region, and each one of said at least one first doped region is located corresponding to the channel region.

In some embodiments, a number of the first doped region and the second doped region is at least one.

In some embodiments, a number of said at least one first doped region is two or more.

In some embodiments, a channel width of the channel region matches a size of said at least one first doped region.

In some embodiments, the gate structure comprises: at least one trench gate, located in the well region, wherein a number of said at least one trench gate matches a number of said at least one second doped region.

In some embodiments, the gate structure further comprises: at least one planar gate, a number of which is matched with the number of said at least one first doped region of the source end, wherein said at least one planar gate covers the channel region.

In some embodiments, on a contact surface between the gate structure and the source-end doped region, a pattern of each one of said at least one trench gate extends into a pattern of a corresponding one of said at least one first doped region.

In some embodiments, on the contact surface of the gate structure with the source-end doped region, a pattern of each one of said at least one second doped region is located in a pattern of a corresponding one of said at least one trench gate, and the pattern of each one of said at least one first doped region is in contact with the pattern of a corresponding one of said at least one second doped region.

In some embodiments, the doping type of said at least one first doped region is N type, the doping type of said at least one second doped region is P type.

According to another aspect of the present disclosure, a manufacturing method of a semiconductor device is provided, wherein the semiconductor device can be the semiconductor device provided according to any one of the embodiments of the present disclosure. The manufacturing method comprises: forming the well region on the substrate; forming the gate structure in the well region; forming the drain-end doped region on a side of the substrate, wherein the side of the substrate is away from the well region; and forming the source-end doped region in the well region, wherein the source-end doped region comprises at least one first doped region and at least one second doped region, a side surface of each of said at least one first doped region is in contact with the trench gate structure, wherein a doping type of the source-end doped region is same with a doping type of said at least one first doped region, and is opposite to a doping type of said at least one second doped region, wherein, the step of forming the well region comprise: forming a well-region trench on the substrate by etching; and forming the well region in the well-region trench by performing epitaxy with well-region material.

In some embodiments, after forming the well-region trench by etching, the manufacturing method further comprises: forming an oxide layer on an inner wall of the well-region trench by thermal growth; and removing the oxide layer.

In some embodiments, the step of forming the well region comprises: forming the well region with uniform impurity concentration by performing a rapid thermal epitaxy process.

In some embodiments, the step of forming the gate structure comprises: forming a first trench structure and a second trench structure by etching at a side of the well region, wherein the side of the well region is adjacent to the drain-end doped region; forming a gate oxide layer on inside walls of the first trench structure and the second trench structure; forming a polysilicon layer on the gate oxide layer, to form a first trench gate and a second trench gate; forming a gate oxide layer and a polysilicon layer sequentially on a surface of the semiconductor device obtained after forming the first trench gate and the second trench gate; and forming a planar gate on an upper portion between the first trench gate and the second trench gate, by etching the gate oxide layer and the polysilicon layer.

In some embodiments, the drain-end doped region is an N-type doped region, said at least one first doped region is an N-type doped region, and said at least one second doped region is a P-type doped region.

The semiconductor device provided by the present disclosure comprises the substrate, the drift region located on the substrate, the well region located on the drift region, the source-end doped region located in the well region, the drain-end doped region located on the drift region and opposite to the source-end doped region, and the gate structure which is located at a position of the well region and between the source end and the drain end, wherein the gate structure forms the channel region in the well region, the source-end doped region comprises at least one first doped region and at least one second doped region with opposite doping types, the doping type of said at least one first doped region is the same as that of the drain-end doped region, and the channel region connects said at least one first doped region with the drift region. Said at least one first doped region and said at least one second doped region of the source end are equivalently close to the gate structure, thus a distance between each second doped region and a PN junction surface formed by the drift region and the well region is reduced, so that when the semiconductor device provided by the present disclosure is in a reverse voltage-withstanding state, a flow path of a hole current in the well region from the PN junction surface formed by the well region and the drift region to said at least one second doped region of the source end is shortened, thus effectively relieving an increase of a voltage drop on the well region, preventing a parasitic triode, composed of said at least one second doped region, the well region and the drift region, from being mistakenly turned on, and effectively improving the self-protection capability of the semiconductor device.

The channel region has a plurality of sub channel regions, thus effectively improving a uniformity of the current flowing to the drift region, and reducing a resistance of the drift region, so that a conduction voltage drop of the device can be reduced, and the current capability of the device can be improved.

A side wall, which is close to the source end, of each one of said at least trench gate can completely cover a side wall of a corresponding one of said at least one second doped region of the source end, and is in contact with a corresponding one of said at least one first doped region, to ensure a connection between the channel region and the source-end doped region.

According to the manufacturing method of the semiconductor device provided in the present disclosure, the well-region trench is formed at the position of the well region of the semiconductor device by etching. Corresponding doping materials are introduced by epitaxy performing in the well-region trench, to form the well region with uniform doping concentration along the longitudinal direction. Said at least one trench gate structure is formed in the well region to serve as a trench gate, thereby optimizing the interface of the trench gate and the well region, optimizing the uniformity of the longitudinal doping concentration of the well region at the interface, further optimizing consistency of the threshold voltage of the trench gate, and thusly optimizing electrical characteristics of the semiconductor device.

The oxide layer is formed on the inner wall of the well-region trench by performing a thermal growth process. After the oxide layer is removed, well-region doping materials are introduced by epitaxy performing in the well region trench, so that the well-region trench with good interface state can be obtained, and unfavorable defects at the interface can be reduced, so as to further optimize electrical characteristics and reliability of the semiconductor device.

Furthermore, the well region is deposited by performing the rapid thermal epitaxy process, thereby effectively reducing the diffusion degree of impurities, further ensuring the uniformity of doping material concentration in the well region and optimizing electrical characteristics of the semiconductor device.

The trench gate can also be formed by performing etching and oxidation processes, thus the gate trench with uniform surface can be obtained, so that the interface state of the channel region can be further optimized, the threshold voltage and the electrical characteristics of the semiconductor device can thusly be optimized.

BRIEF DESCRIPTION OF THE DRAWINGS

The above and other objectives, features and advantage of the present disclosure will become more apparent from the following description below for embodiments of the present disclosure with reference to the accompanying drawings, in which.

DESCRIPTION OF THE EMBODIMENTS

Figure 1:
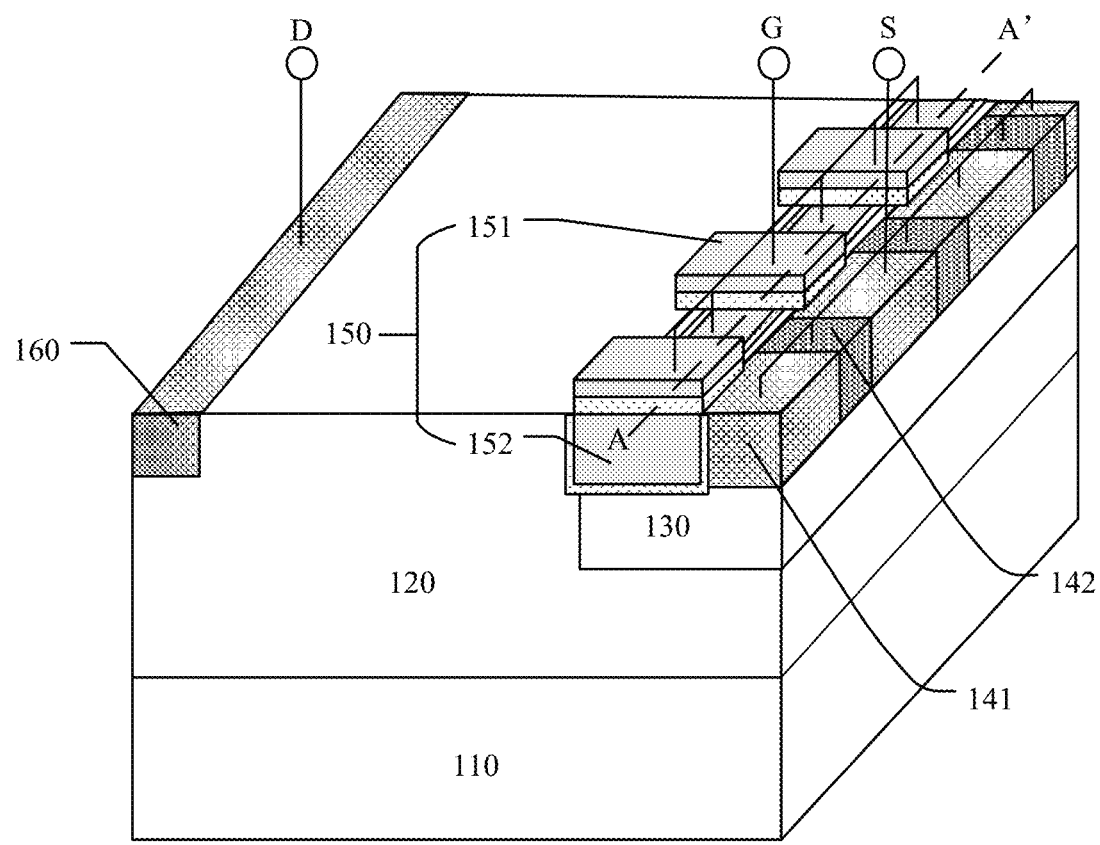
FIG. 1 shows an overall structural schematic diagram of a semiconductor device according to an embodiment of the present disclosure.

Various embodiments of the invention will be described in more detail below with reference to the accompanying drawings. Throughout the drawings, like elements are denoted by like or similar reference numerals. For clarity, various parts in the figures are not drawn to scale. In addition, some public information may not be disclosed. For the sake of brevity, the semiconductor structure obtained after several steps can be described in one accompanying drawing.

When describing the structure of a device, if a layer or a region is referred to as "on" or "above" another layer or another region, it can mean that the layer or the region is located directly on the another layer or the another region, or there are other layers or other regions between the layer or the region and the another layer or the another region. Moreover, if the device is flipped, the layer or the region will be "beneath" or "below" the another layer or the another region.

In order to better understand technical solutions of the present disclosure, many specific details, such as structure, materials, dimensions, treatment processes and techniques of semiconductor devices, are described below. However, a person skilled in the art should understand that the present disclosure can still be implemented without certain specific details.

Unless specifically noted below, the layers or the regions of the semiconductor devices may be composed of material well known to those skilled in the art. Semiconductor materials include III-V semiconductors, such as GaAs, InP, Gan, and SiC, and IV semiconductors, such as Si, and Ge. Gate conductor and electrode layer may be formed form various conductive materials, such as metal layer, doped polysilicon layer, stacked gate conductor including the metal layer, the doped polysilicon layer, and other conductive materials, such as TaC, TiN, TaSiN, HfSiN, TiSiN, TiCN, TaAlC, TiAlN, TaN, PtSix, Ni3Si, Pt, Ru, W, and a combination of the various conductive materials. Gate dielectric may consist of SiO2 or materials with a dielectric constant greater than SiO2, such as oxides, nitrides, oxynitrides, silicates, aluminates, and titanates. Moreover, the gate dielectric can be formed not only from materials known to the skilled in the art, but also materials developed in the future for the gate dielectric.

Specific embodiments of the present disclosure are further described in detail referring to the accompanying drawings and the embodiments below.

Figure 2:
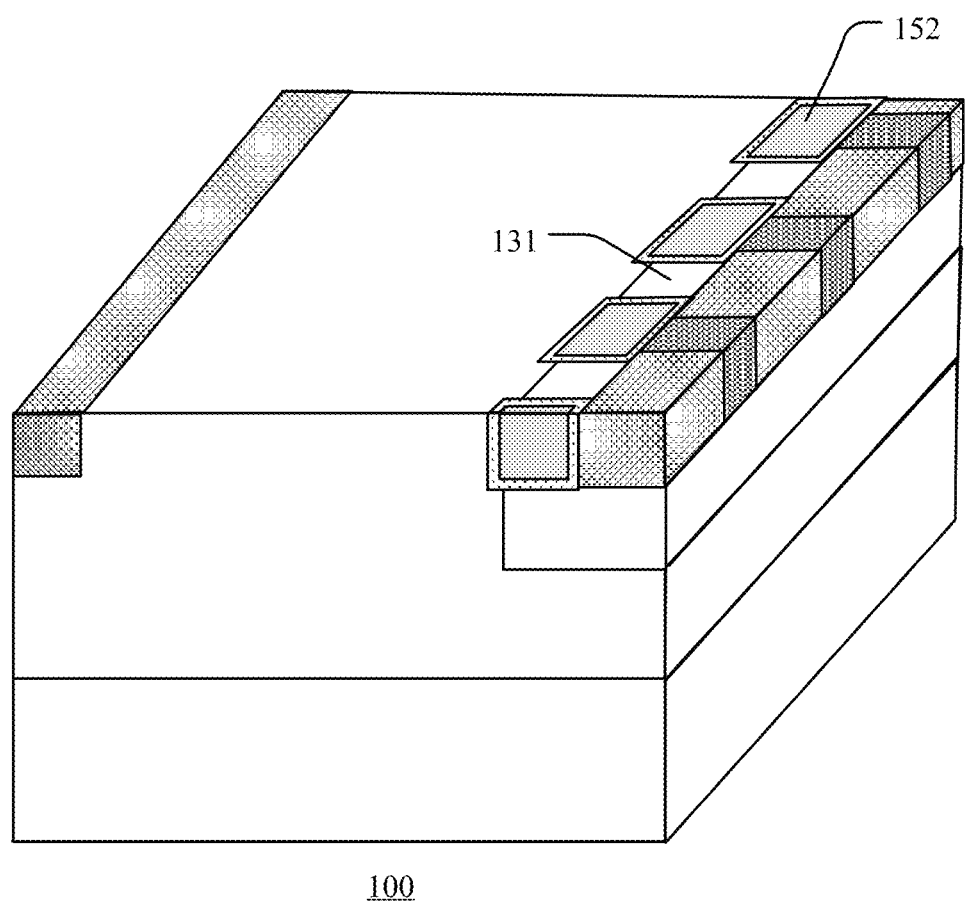
FIG. 2 shows a partial structural diagram of a semiconductor device according to an embodiment of the present disclosure.

FIG. 1 shows an overall structural diagram of a semiconductor device according to an embodiment of the present disclosure, and FIG. 2 shows a partial structural diagram of a semiconductor device according to an embodiment of the present disclosure. Referring to FIG. 1 and FIG. 2, taking an N-type LDMOS as an example, the semiconductor device 100 according to an embodiment of the present disclosure comprises a P-type substrate 110, an N-type drift region 120, a P-type well region 130, an N-type doped region 141, a P-type doped region 142, a gate structure 150, and a drain-end N-type doped region 160. Wherein, the P-type substrate 110 may be a P-type doped silicon substrate. N-type doping and P-type doping are opposite doping types.

The N-type drift region 120 is located on the P-type substrate 110, the P-type well region 130 is located at one end in a transverse direction of an upper surface of the N-type drift region 120, and the N-type doped region 160 is located at another end opposite to said one end along the transverse direction of the N-type drift region, to form a drain end D.

The N-type doped region 141 and the P-type doped region 142 are alternately distributed in the P-type well region 130 on the upper surface of the P-type well region 130 in a longitudinal direction, the N-type doped region 141 and the P-type doped region 142 are interconnected to form a source end S. A number of the N-type doped region 141 can be one or more, and a number of the P-type doped region 142 can be one or more.

The gate structure 150 is disposed between the source end S and the drain end D, and is in contact with a side wall of the N-type doped region 141 and the P-type doped region 142, which form the source end S. The gate structure 150 comprises at least one planar gate (e.g. a planar gate 151) and at least one trench gate (e.g. a trench gate 152), which are alternately distributed on its top-view surface. A lower surface of the planar gate 151 and a lower surface and a side surface of the trench gate 152 of the gate structure 150 form a channel region 131, which is a fin channel region as a whole. The longitudinal direction is a direction perpendicular to the aforementioned transverse direction on the upper surface of the drift region 120, which is a basic exemplary design. However, it is also feasible if an angle between the two directions is not 90 degrees. A number of the planar gate 151 can be one or more, and a number of the trench gate 152 can be one or more.

The N-type doped region 141 and the P-type doped region 142, which form the source end, are in contact with a side wall of the gate structure 150, and the planar gate 151 of the gate structure 150 covers to at least a portion of the N-type doped region 141, thereby ensuring a connection between the channel region 131 and the N-type doped region 141. Meanwhile, the side wall, which is parallel to the source-end doped region, of the gate structure 150 is in contact with the source-end doped region, while a bottom surface of the trench gate 152 forms the channel region together with the side wall, which is perpendicular to the source-end doped region, of the trench gate 152, thus the channel region is directly connected with the N-type doped region 141, thereby ensuring the connection between the channel region and the N-type doped region 141.

The P-type doped region 142 is disposed on a side of the gate structure 150, and at an contact surface between the gate structure 150 and the source-end doped region, a pattern of the P-type doped region 142 is located within a pattern of the trench gate 152, thus, not only a leading-out design of the source-end doped region cannot be affected, but also a distance between the P-type doped region 142 and a junction surface, formed by the P-type well region 130 and the N-type drift region 120, can be effectively reduced. Compared with a conventional solution, where a P-typed doped region is arranged at a side wall, which is far away from a gate structure, of the N-type doped region, the present disclosure can effectively shorten a flow path of holes generated by collision ionization in the P-type well region, and under a voltage-withstanding state of the device, the voltage drop on the P-type well region can be reduced, a parasitic NPN structure, formed by the N-type doped region 141, the P-type well region 130 and the N-type drift region 120, can be prevented from being mistakenly turned on, and the self-protection capability of the semiconductor device 100 according to the embodiment of the present invention can be effectively improved. Meanwhile, the N-type doped region 141 is corresponding to the planar gate 151, and the P-type doped region is corresponding to the trench gate 152, so that a tradeoff between a leading-out design of the N-type doped region 141 and a leading-out design of the P-type doped region 142 can be performed with maximum efficiency.

The N-type doped region is a region rich in electrons, and the P-type doped region is a region rich in holes. The above-mentioned embodiment takes an N-type LDMOS as an example, where the above-mentioned flow path is the flow path of holes in the well region. It should be understood that, if the semiconductor device is a P-type LDMOS, the flow path will be a flow path of electrons in the well region, thus the above-mentioned flow path should be understood as a flow path of source-end carriers.

Figure 3:
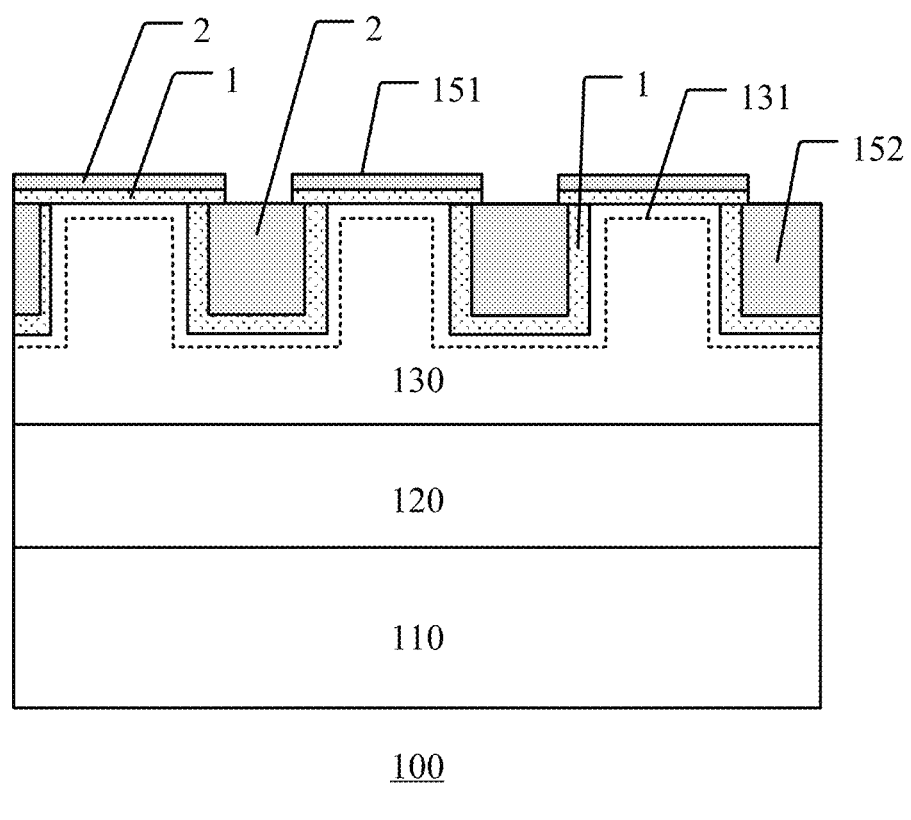
FIG. 3 shows a schematic view of a longitudinal cross-sectional structure of the semiconductor device according to FIG. 1 along AA'.

FIG. 3 shows a schematic view of a longitudinal cross-sectional structure of the semiconductor device according to FIG. 1 along AA'. As shown in FIG. 3, the semiconductor device 100 according to an embodiment of the present disclosure comprises the P-type substrate 110, the N-type drift region 120, the P-type well region 130, the trench gate 152, and the planar gate 151, which are stacked sequentially in the longitudinal cross-sectional structure at a position of the gate structure 150.

The trench gate 151 and the planar gate 152 each include a gate oxide layer 1 and a polysilicon layer 2. A number of the trench gate can be one or more, and a number of the trench gate can be one or more. For example, a plurality of trench gates 151 are distributed at intervals, and each planar gate 152 covers a corresponding interval area between two adjacent trench gates 151. When a certain turn-on voltage is applied to the gate structure 150 of the device to turn on the device, in the P-type well region 130, side walls and bottom surfaces of the trench gates 151 and lower surfaces of the planar gates 151 can form a channel region, which is a fin channel region 131 as a whole.

The fin channel region 131 can increase an effective channel width, which is consistent with a total length of the channel region 131 in the longitudinal cross-section structure shown in FIG. 3, reduce a channel on-resistance, and reduce a specific on-resistance of the semiconductor device 100. The arrangement of interval distribution can make the current density more uniform in the drift region, and reduce a resistance of the drift region, to further reduce the on-resistance of the semiconductor device 100 from another aspect, and thusly the semiconductor device may have a higher breakdown voltage (BV) under a same on-resistance, compared with the prior art.

In order to prevent the parasitic NPN from being mistakenly turned on, a main design of the present disclosure is to arrange the N-type doped region and the P-type doped region of the source end to be equivalently close to one side of the gate structure. For the gate structure, it can selectively contain the planar gate only or contain the trench gate only. If only the trench gate is contained in the gate structure, the planar gate may not be selected to be contained in the gate structure. However, the gate structure containing both of the trench gate and the planar gate is a preferable choice.

According to the semiconductor device of the present disclosure, the N-type doped region and the P-type doped region of the source end are alternately distributed along the side wall, which is far away from the drain end, of the gate structure, and the N-type doped region and the P-type doped region of the source end are equivalently close to the gate structure, which can shorten the distance from the P-type doped region to the junction surface between the drift region and the well region. Thusly, the flow path of holes generated by collision ionization in the P-type well region can be effectively shortened. When the device is in a voltage-withstanding state, the voltage drops on the P-type well region can be reduced, to prevent the parasitic NPN structure from being mistakenly turned on, and to effectively increase the self-protection capability of the semiconductor device 100 according to the embodiments of the present disclosure. Meanwhile, the N-type doped region 141 is located corresponding to the planar gate 151, and the P-type doped region is located corresponding to the trench gate 152, so that a tradeoff between the leading-out design of the N-type doped region 141 and the leading-out design of the P-type doped region 142 can be performed with maximum efficiency.

The gate structure can be a combination of the trench gate and the planar gate, serving a gate function together. The trench gate forms a fin channel region by combining with the planar gate, increasing the effective channel width, reducing the channel on-resistance and reducing the specific on-resistance of the semiconductor device according to the present disclosure. The fin channel region has a plurality of sub channel regions arranged at intervals, making the distribution density of current in the drift region more uniform, reducing the resistance of the drift region, and improving the breakdown voltage of the device.

The planar gate is matched with the N-type doped region of the source end, and the trench gate is matched with the P-type doped region of the source end, ensuring that the N-type doped region of the source end can be led out to the channel region. The planar gate of the gate structure extends to the N-type doped region of the source end, ensuring that the N-type doped region can be led out to the channel region.

In a conventional manufacturing method of a semiconductor device, a P-type well region is formed by implantation, and in a semiconductor body region, impurity distribution in the P-type well region is not uniform in a longitudinal direction, leading to a result that a channel region has different turn-on voltages in different depths along a side wall of a trench gate, different threshold voltages are corresponding to the different depths, thus affecting electrical characteristics of the device.

Therefore, the present disclosure also provides an improvement on a manufacturing method of a semiconductor device according to various embodiments of the present disclosure, with an aim of optimizing electrical characteristics of the semiconductor device.

Figure 4A:
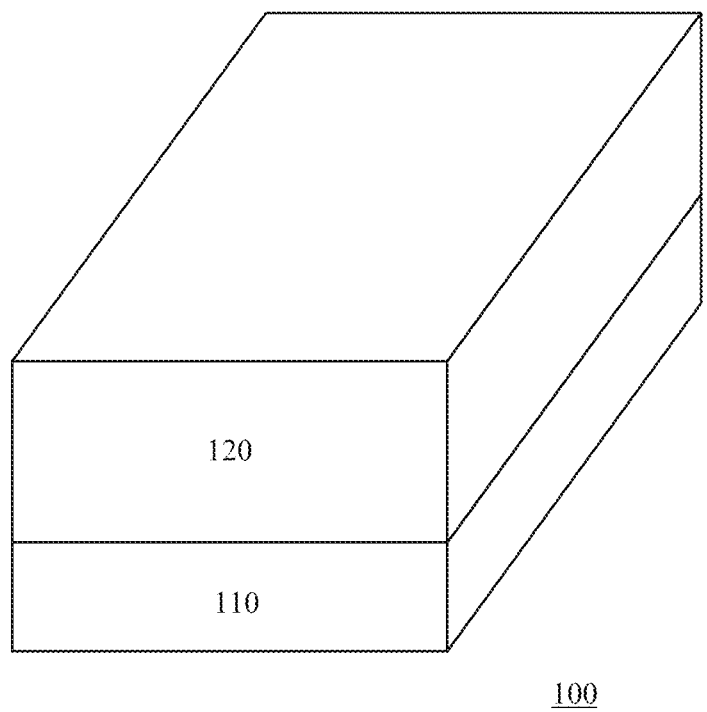
FIGS. 4A to 4H show schematic diagrams in process steps of a manufacturing method of a semiconductor device according to an embodiment of the present disclosure.

FIGS. 4A to 4H show schematic diagrams in process steps of a manufacturing method of a semiconductor device according to an embodiment of the present disclosure. Referring to FIGS. 4A to 4H, the process steps of the manufacturing method of the semiconductor device according to the embodiment of the present disclosure sequentially comprise following steps:

As shown in FIG. 4A, an N-type drift region 120 is grown on a P-type substrate 110; the P-type substrate 110 may be a P-type silicon substrate, and the N-type drift region 120 may be an N-type silicon layer. If the substrate is of N-type, then a well region can be directly manufactured in a next step, so as to improve manufacturing efficiency.

Figure 4B:
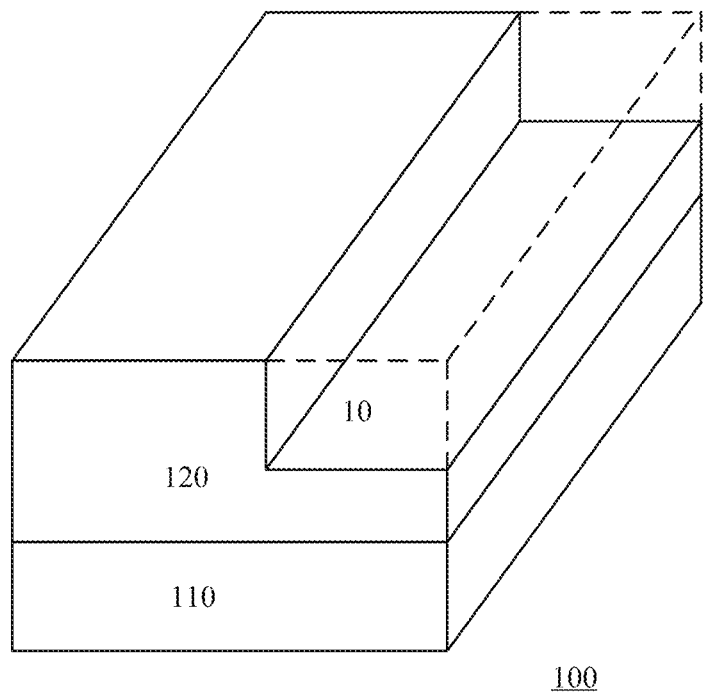

As shown in FIG. 4B, a P-well-region etched trench 10 is formed by etching in the N-type drift region 120 at a position of the P-type well region 130; a patterned photoresist layer is used as a mask for etching.

Figure 4C:
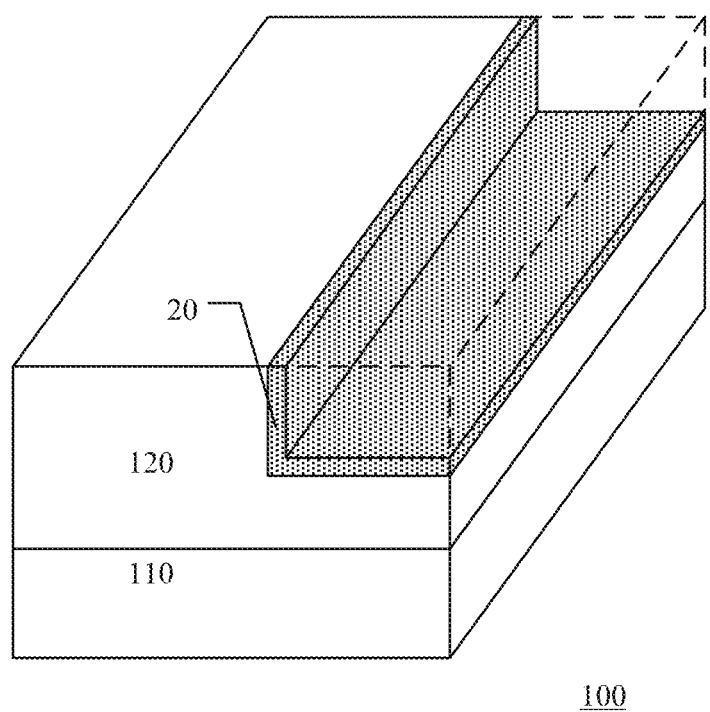

As shown in FIG. 4C, an oxide layer 20 is thermally grown on an inner wall of the P-well-region etched trench 10; the thermally grown oxide layer 20 is formed by a traditional process, which is easy to be implemented, and the flatness of a side wall of the P-well-region etched trench 10 can be optimized.

Figure 4D:
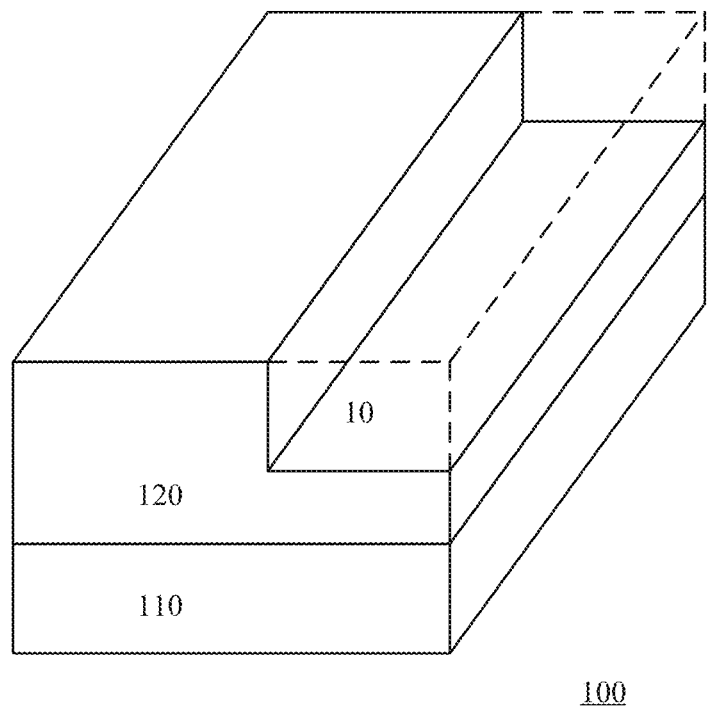

As shown in FIG. 4D, the thermally grown oxide layer 20 on the inner wall of the P-well-region etched trench 10 is then removed; after the oxide layer 20 is removed, the side wall of the P-well-region etched trench 10 has a good interface state and defects are reduced, thus optimizing electrical characteristics and reliability of the device.

Figure 4E:
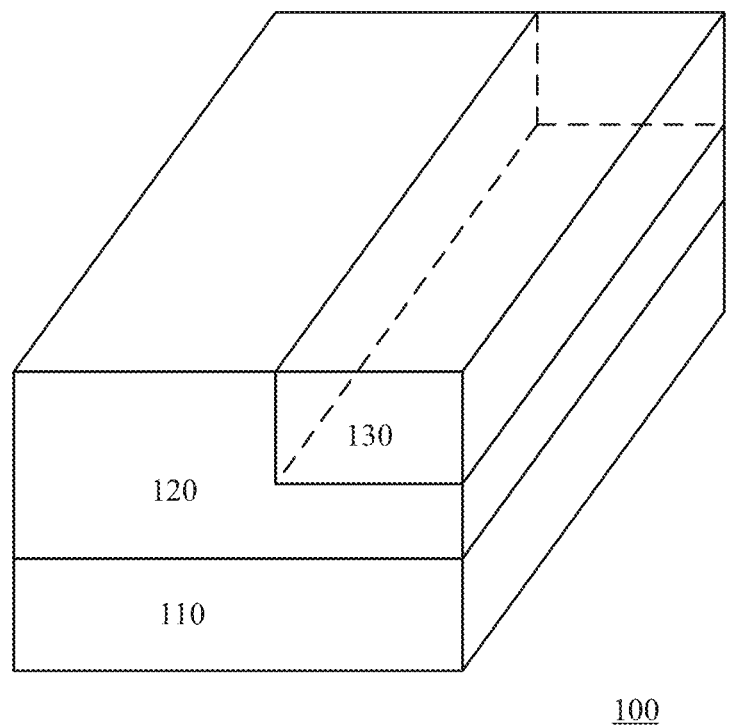

As shown in FIG. 4E, after the oxide layer 20 is removed, the P-type well region 130 is epitaxially formed in the P-well-region etched trench 10; the P-type well region can be formed by a rapid thermal epitaxial growth process, thus effectively reducing the diffusion between the P-type well region and the N-type region, and an impurity doping concentration of the P-type well region can be more uniform.

Figure 4F:
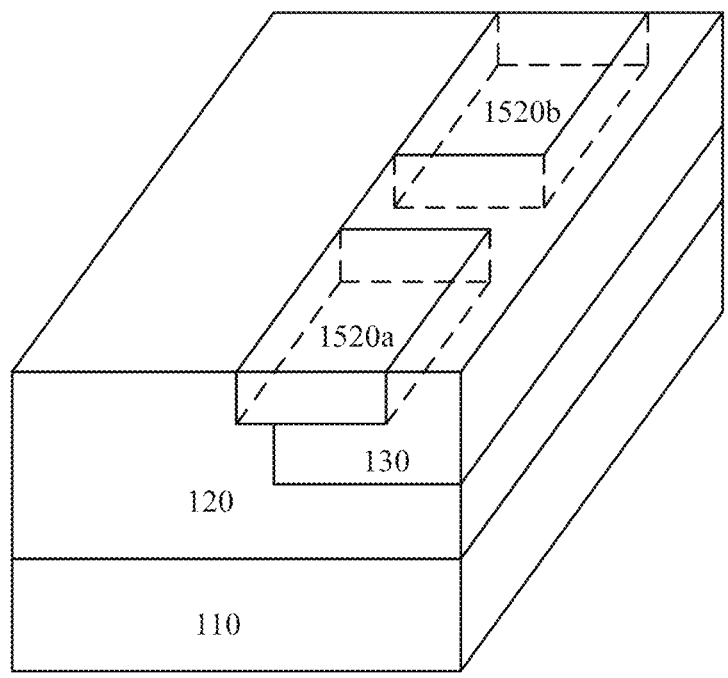

As shown in FIG. 4F, a first trench region 1520a and a second trench region 1520b are formed in the P-type well region 130 by etching. It should be understood that, the number of the trench region is not limited to 2, it is matched with the number of said at least one trench gate, thus can be one or more than 2 in some embodiments.

Figure 4G:
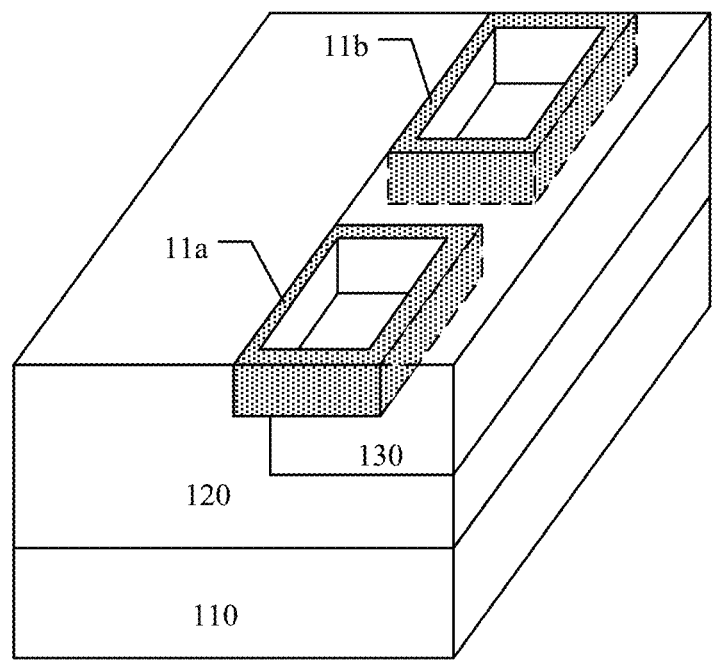

As shown in FIG. 4G, a gate oxide layer 11a and a gate oxide layer 11b are formed on inner walls of the first trench region 1520a and the second trench region 1520a, respectively, by thermal oxidation.

Figure 4H:
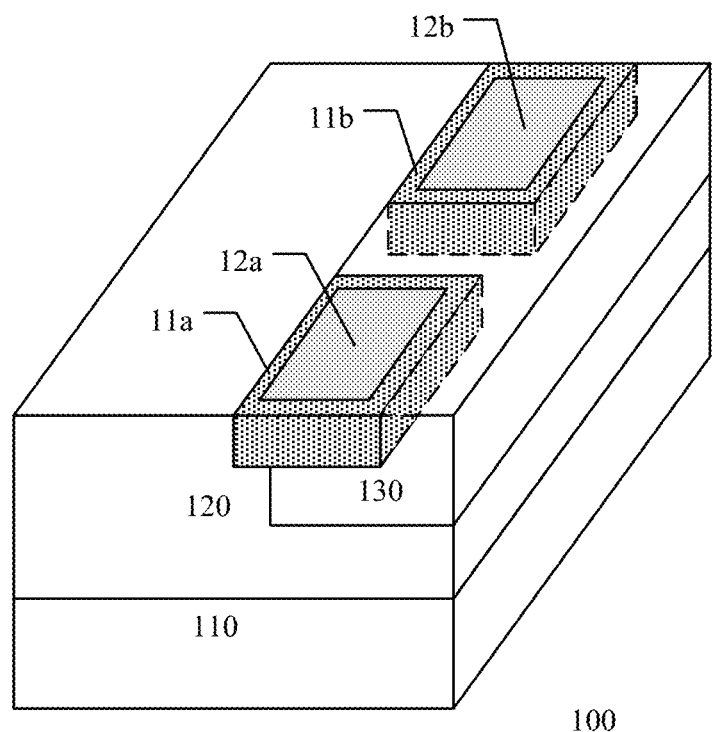

As shown in FIG. 4H, after the gate oxide layers are formed, a polysilicon layer 12a and a polysilicon layer 12b are formed in the first trench region 1520a and the second trench region 1520a respectively by deposition, thus a first gate region and a third gate region are formed. The first gate region and the third gate region serve as two trench gates referring to FIG. 1, however, the number of the trench gates is not limited to 2, it should be understood that only one trench gate or more than two trench gates can be formed in some embodiments.

Then, referring to FIG. 1, by a traditional process, an N+ doped region 160 is formed in the N-type drift region 120, at least one N+ doped region 141 and at least one P+ doped region 142 are formed in the P-type well region 130, and a second gate region serving as a planar gate (e.g. the planar gate 151) is formed, and then, a source electrode, a drain electrode and a gate electrode are formed, thus the manufacturing process of the semiconductor device according to the embodiment of the present disclosure is completed. In this embodiment, the P-type well region 130 is located in the N-type drift region 120, and the N-type drift region can be formed by implantation or epitaxy, or can be an N-type substrate directly.

In the above-described embodiment, an N-type LDMOS device is taken as an example for illustration, however, embodiments of the present disclosure are not limited to this embodiment. The main points of the present disclosure comprise: forming a well-region trench structure by etching, forming a well region by epitaxy, for optimizing concentration uniformity in the longitudinal direction of the well region, and optimizing consistency of the threshold voltage of the trench gate, to improve electrical characteristics of the semiconductor device and exert maximum advantages of the trench gate. That is, manufacturing methods according to the present disclosure mainly aim at optimizing the manufacturing method of the well region. However, implementations of the manufacturing methods are not limited by semiconductor types, and the manufactured device is not limited to an N-type LDMOS device. Those skilled in the art can apply manufacturing methods according to the present disclosure to P-type LDMOS devices or other semiconductor devices without creative labor.

Figure 5:
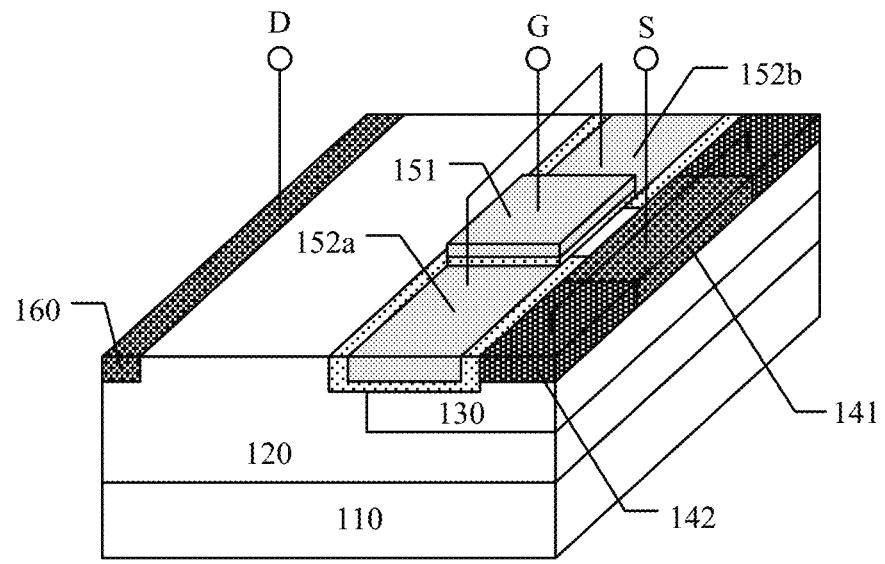
FIG. 5 shows a schematic structural diagram of an LDMOS device.
Figure 6:
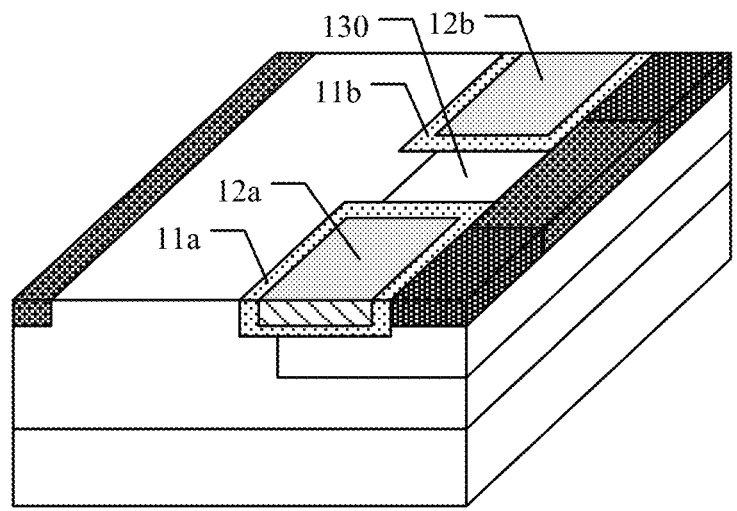
FIG. 6 shows a schematic structural diagram of a portion of the LDMOS device according to FIG. 5.

A manufacturing method according to the present disclosure can be used for manufacturing semiconductor devices according to embodiments of the present disclosure, for example, a manufacturing method can be used for manufacturing a three-gate semiconductor device as shown in FIGS. 5 and 6.

FIG. 5 shows a schematic structural diagram of an LDMOS device, and FIG. 6 shows a schematic structural diagram of a portion of the LDMOS device according to FIG. 5. Referring to FIGS. 5 and 6, the LDMOS device 100 comprises a P-type substrate 110, an N-type drift region 120, a P-type well region 130, an N+ doped region 160, at least one N+ doped region (e.g. N+ doped region 141), at least one P+ doped regions (e.g. P+ doped regions 142), at least one trench gate (e.g. a first gate region 152a and a third gate region 152b), and at least one planar gate (e.g. a second gate region 151). As an example, the first gate region 152a, the second gate region 151, and the third gate region 152b form a gate structure serving as a gate G.

The N-type drift region 120 is located on the P-type substrate 110; the P-type well region 130 is located in a right end of the N-type drift region 120; the first gate region 152a, the second gate region 151, and the third gate region 152b are disposed at an interface between the N-type drift region 120 and the P-type well region 130, and are longitudinally arranged in sequence, wherein the second gate region 151 is located on an upper layer of the first gate region 152a and the third gate region 152b; the N+ doped region 160 has a long trench structure, which is located in a left end of the N-type drift region 120 and forms a drain end D; the N+ doped region 141 and the P+ doped regions 142 are located in the P-type well region 130, and the N+ doped region 141 and the P+ doped regions 142 together form a source end S. The arrangement of the N+ doped region 141 and the P+ doped regions 142 may be as described in all above embodiments (e.g., shown in FIG. 1) and not limited to the embodiments shown in FIG. 5 and FIG. 6.

The first gate region 152a and the third gate region 152b serve as trench-type gates, and between them is a channel region extending from a source-end doped region to the drift region. The second gate region 151, at least the polysilicon layer of the second gate region 151, completely covers on the channel region.

An inner layer of the first gate region 152a is a polysilicon layer 12a, and an outer layer of the first gate region 152a is a gate oxide layer 11a; an inner layer of the third gate region 152b is a polysilicon layer 12b, and an outer layer of the third gate region 152b is a gate oxide layer 11b. Similarly, the second gate region 151 includes a lower gate oxide layer and an upper polysilicon layer. When a certain voltage is applied to the gate, a path through the channel region which is located at the bottom of the second gate region 151, the bottom of the first gate region 152a, and the bottom of the third gate region 152b, as well as located around the first gate region 152a and the third gate region 152b, is turned on, thus a path between the source end and drain end is conductive.

In a conventional manufacturing method, the P-type well region 130 is formed by performing implantation on the whole N-type drift region 120. Implanted impurities in the P-type well region are not uniformly distributed along the longitudinal direction, leading to a result that the channel area, which is a portion of the P-type well region 130 forming a gate channel region, has different turn-on voltages in different depths, that is, the channel region has different threshold voltages in different depths, thus affecting electrical characteristics of the device. When the threshold voltage of the device is quite different from a designed voltage, the device cannot be used in some systems requiring high precision.

While, according to the manufacturing method of the semiconductor device described in the present disclosure, the P-type well region is formed by forming a trench structure by etching, growing the oxide layer on an inner wall of the trench structure, removing the oxide layer, and epitaxially growing the P-type well region thereafter, thus it can be ensured that the N-type drift region and the P-type well region have a good flat contact surface, impurities and interface defects can be effectively reduced or removed, so that the stability of the threshold voltage can be ensured. The well region is formed by epitaxy, thus, compared with a well region manufactured by implantation in a conventional method, an overall concentration of impurities doped in the manufactured well region is relatively uniform along the longitudinal direction, ensuring that the channel region around the trench gate and at the bottom of the trench gate has a uniform and consistent threshold voltage, thereby improving electrical characteristics of the device.

Forming the well region by a rapid thermal epitaxy process can effectively weaken impurity diffusion between the P-type well region and the N-type drift region, thereby ensuring uniformity and stability of the impurity concentration in the P-type well region, so that consistency of the threshold voltage of the device can be ensured.

In some embodiments, the manufacturing method of the semiconductor device can also be used for other semiconductor device with a trench gate, aiming at improving stability and consistency of the threshold voltage of the semiconductor device. For example, a manufacturing method according to an embodiment of the present disclosure can be used to manufacture a three-gate semiconductor device as shown in FIGS. 7 and 8.

Figure 7:
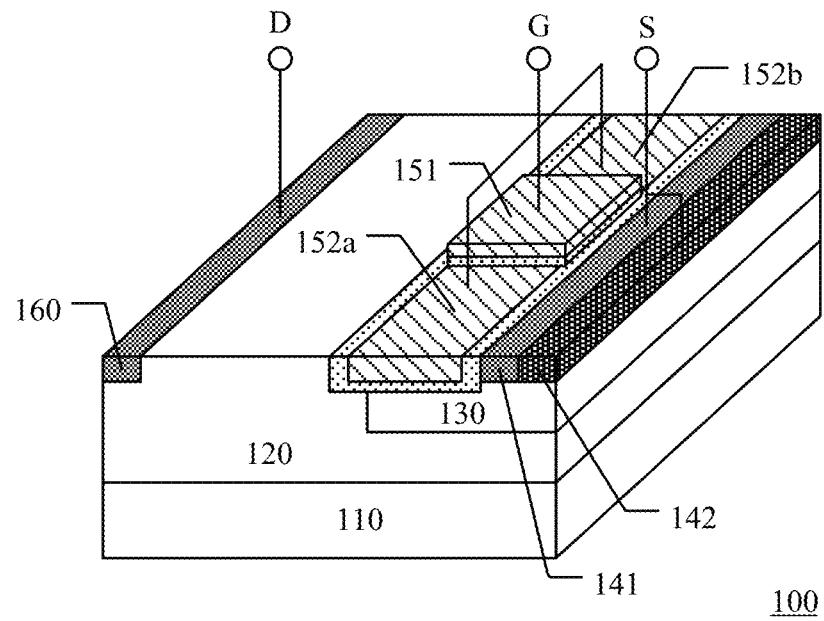
FIG. 7 shows a schematic structural diagram of an LDMOS device that can be manufactured using the manufacturing method according to the embodiment of the present disclosure.
Figure 8:
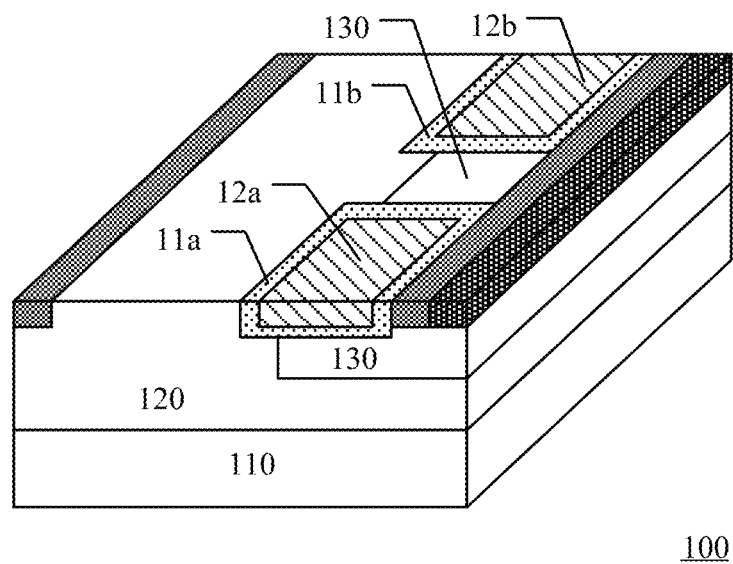
FIG. 8 shows a schematic structural diagram of a portion of the LDMOS device according to FIG. 7.

FIG. 7 shows a schematic structural diagram of an LDMOS device that can be manufactured using the manufacturing method according to the embodiment of the present disclosure, and FIG. 8 shows a schematic structural diagram of a portion of the LDMOS device according to FIG. 7. Referring to FIGS. 7 and 8, the LDMOS device 100 comprises a P-type substrate 110, an N-type drift region 120, a P-type well region 130, an N+ doped region 160, at least one N+ doped region (e.g. an N+ doped region 141), at least one P+ doped region 142 (e.g. a P+ doped region 142), at least one trench gate (e.g. a first gate region 152a and a third gate region 152b), and at least one planar gate (e.g. a second gate region 151). The first gate region 152a, the second gate region 151, and the third gate region 152b together form a gate structure, serving as a gate G.

The N-type drift region 120 is located on the P-type substrate 110; the P-type well region 130 is located in a right end of the N-type drift region 120; the first gate region 152a, the second gate region 151, and the third gate region 152b are disposed at an interface between the N-type drift region 120 and the P-type well region 130, and are longitudinally arranged in sequence, wherein the second gate region 151 is located on an upper layer of the first gate region 152a and the third gate region 152b; the N+ doped region 141 is a long trench region, which is located in a left end of the N-type drift region 120 and forms a drain end D; the N+ doped region 141 is a long trench region, located in the P-type well region 130, and is in contact with a right-side wall of the trench gate; the P+ doped region 142 is a long trench region located in the P-type well region 130 and is in contact with a right-side wall of the N+ doped region 141, thus the P+ doped region 142 and the N+ doped region 141 form a source end S together.

The first gate region 152a and the third gate region 152b are trench-type gates, and between them is a channel region extending from the source-end doped region to the drift region. The second gate region 151, at least the polysilicon layer of the second gate region 151, completely covers on the channel region.

An inner layer of the first gate region 152a is a polysilicon layer 11a, and an outer layer is a gate oxide layer 12a; an inner layer of the third gate region 152b is a polysilicon layer 11b, and an outer layer is a gate oxide layer 12b. Similarly, the second gate region 151 includes a lower gate oxide layer and an upper polysilicon layer. When a certain voltage is applied to the gate, a path formed by the channel region, which is located at the bottom of the second gate region 151, the bottom of the first gate region 152a, and the bottom of the third gate region 152b as well as located around the first gate region 152a and the third gate region 152b, is turned on, thus the path between the source end and the drain end is turned on to be conductive.

In a conventional method, the P-type well region 130 is formed by performing implantation on the whole N-type drift region 220. Implanted impurities in the P-type well region are not uniformly distributed along the longitudinal direction, leading to a result that the channel area, which is a portion of the P-type well region 130 forming a gate channel region, has different turn-on voltages in different depths, that is, the channel region has different threshold voltages in different depths, thus affecting electrical characteristics of the device. When the threshold voltage of the device is quite different from a designed voltage, the device cannot be used in some systems requiring high precision.

Different from the conventional manufacturing method, the manufacturing method according to the embodiment of the present disclosure comprises different steps to form the P-type well region 130. As an example, the manufacturing method of the semiconductor device 100 shown in FIGS. 7 and 8 according to the present disclosure, comprises process steps shown in FIGS. 4A to 4H.

As shown in FIG. 4A, the N-type drift region 120 is grown on the P-type substrate 110; the P-type substrate 110 may be a P-type silicon substrate, and the N-type drift region 120 may be an N-type silicon layer. If the substrate is of N-type, then the well region can be directly manufactured in a next step, so as to improve manufacturing efficiency.

As shown in FIG. 4B, a P-well-region etched trench 10 is formed by etching the N-type drift region 120 at the position of the P-type well region 130; a patterned photoresist layer is used as a mask for etching.

As shown in FIG. 4C, an oxide layer 20 is thermally grown on an inner wall of the P-well-region etched trench 231; the thermally grown oxide layer 20 is formed by a traditional process, which is easy to be implemented, and the flatness of a side wall of the P-well-region etched trench 10 can be optimized.

As shown in FIG. 4D, the thermally grown oxide layer 20 on the inner wall of the P-well-region etched trench 10 is then removed; after the oxide layer 20 is removed, the side wall of the P-well-region etched trench 10 has a good interface state, and defects are reduced, thus optimizing electrical characteristics and reliability of the device.

As shown in FIG. 4E, after the oxide layer 20 is removed, the P-type well region 130 is epitaxially formed in the P-well-region etched trench 231; the P-type well region can be formed by a rapid thermal epitaxial growth process, thus can effectively reduce the diffusion between the P-type well region and the N-type region, and an impurity doping concentration of the P-type well region can be more uniform.

As shown in FIG. 4F, a first trench region 1520a and a second trench region 1520b are formed in the P-type well region 130 by etching. It should be understood that, the number of the trench region is not limited to 2, it is matched with the number of said at least one trench gate, thus can be one or more than 2 in some embodiments.

As shown in FIG. 4G, a gate oxide layer 11*a* and a gate oxide layer 11*b* are formed on inner walls of the first trench region 1520*a* and the second trench region 1520*b*, respectively, by thermal oxidation.

As shown in FIG. 4H, after the gate oxide layer is formed, a polysilicon layer 12*a* and a polysilicon layer 12*b* are formed in the first trench region 1520*a* and the second trench region 1520*b* respectively by deposition, thus a first gate region and a third gate region are formed. The first gate region and the third gate region serve as two trench gates; however, the number of the trench gates is not limited to 2, it should be understood that only one trench gate or more than two trench gates can be formed in some embodiments.

Then, referring to FIG. 7, by a traditional process, the N+ doped region 160 is formed in the N-type drift region 120, the N+ doped region 141 and the P+ doped region 142 are formed in the P-type well region 130, and a second gate region serving as a planar gate is formed, and then, a source electrode, a drain electrode and a gate electrode are formed, thus the manufacturing process of the semiconductor device according to the embodiment of the present disclosure is completed. In this embodiment, the P-type well region 130 is located in the N-type drift region 220, and the N-type drift region can be formed by implantation or epitaxy, or can be an N-type substrate directly.

According to the manufacturing method of the semiconductor device described in the present disclosure, the P-type well region is formed by forming a trench structure by etching, growing the oxide layer on an inside wall of the trench structure, removing the oxide layer, and then epitaxially growing the P-type well region thereafter, thus it can be ensured that the N-type drift region and the P-type well region have a good flat contact surface, effectively reducing or removing impurities and interface defects, and ensuring stability of the threshold voltage. The well region is formed by epitaxy, thus, compared with a well region manufactured by implantation in a conventional process, an overall concentration of impurities doped in the manufactured well region is relatively uniform along the longitudinal direction, ensuring that the channel region around the trench gate and at the bottom of the trench gate has a uniform and consistent threshold voltage, thereby improving electrical characteristics of the device.

Forming the well region using a rapid thermal epitaxy process can effectively weaken impurity diffusion between the P-type well region and the N-type drift region, thereby ensuring uniformity and stability of the impurity concentration in the P-type well region, so that consistency of the threshold voltage of the device can be ensured.

In the above-described embodiment, an N-type LDMOS device is taken as an example for illustration, however, embodiments of the present disclosure are not limited to this. The main points of the present disclosure comprise: forming a well-region trench structure by etching, forming a well region by epitaxy, thus optimizing concentration uniformity in the longitudinal direction of the well region, and optimizing consistency of the threshold voltage of the trench gate, to improve electrical characteristics of the device, and exert maximum advantages of the trench gate. That is, manufacturing methods according to the present disclosure mainly aims at optimizing the manufacturing method of the well region. However, the implementations of the manufacturing method are not limited by semiconductor types, and the manufactured device is not limited to an N-type LDMOS device. Those skilled in the art can apply manufacturing methods according to the present disclosure to P-type LDMOS devices or other semiconductor devices without creative labor.

A manufacture method of a semiconductor device according to an embodiment of the present disclosure may also be described as following clauses:

Clause 1: A manufacturing method of a semiconductor device, comprising: forming a well region on a substrate; forming a trench gate structure in the well region; forming a first doped region on a side of the substrate, to form a drain region, wherein the side of the substrate is away from the well region; and forming a second doped region and a third doped region in the well region, to form a source region, wherein a side surface of the second doped region is in contact with the trench gate structure, a doping type of the first doped region is same with a doping type of the second doped region, and is opposite to a doping type of the third doped region, wherein, the step of forming the well region comprises: forming a well-region trench on the substrate by etching; and forming the well region in the well-region trench by performing epitaxy.

Clause 2: The manufacturing method according to clause 1, wherein the substrate comprises a drift region, and the well region is located in the drift region.

Clause 3: The manufacturing method according to clause 2, wherein the drift region is a portion of the substrate.

Clause 4: The manufacturing method according to clause 1, wherein after forming the well-region trench by etching, the manufacturing method further comprises: forming an oxide layer on an inner wall of the well-region trench by thermal growth; and removing the oxide layer.

Clause 5: The manufacturing method according to clause 1, wherein, the step of forming the well region comprises: forming the well region with uniform impurity concentration by performing a rapid thermal epitaxy process.

Clause 6: The manufacturing method according to clause 1, wherein the step of forming the trench gate structure comprises: forming a first trench structure and a second trench structure at a side of the well region by etching, wherein the side of the well region is adjacent to the first doped region; forming a gate oxide layer on inner walls of the first trench structure and of the second trench structure; forming a polysilicon layer on the gate oxide layer, so as to form a first trench gate and a second trench gate; forming a gate oxide layer and a polysilicon layer sequentially on a surface of the semiconductor device, after the first trench gate and the second trench gate are formed; and forming a planar gate on an upper portion between the first trench gate and the second trench gate by etching the gate oxide layer and the polysilicon layer.

Clause 7: The manufacturing method according to any one of clauses 1 to 6, wherein, the first doped region is an N-type doped region, and the third doped region is a P-type doped region.

The present disclosure further provides a semiconductor device manufactured by the manufacturing method according to any one of clauses 1 to 7.

According to the embodiments of the present disclosure described above, these embodiments neither describe all the details in detail, nor limit the present disclosure to only the specific embodiments described. Obviously, according to the above description, many modifications and changes can be made. In order to better explain the principle and practical application of the present invention, the present specification selects and specifically describes these embodiments, so that the person skilled in the technical field can make good use of the present invention and the modification based on the present invention. The present invention is only limited by the claims, full scope and equivalents of the claims.

The invention claimed is:

1. A semiconductor device, comprising:
a substrate;
a drift region, located on the substrate;
a drain-end doped region, located at one end of an upper surface of the drift region in a first direction;
a well region, located at another end of the upper surface of the drift region, wherein said another end is opposite to the drain-end doped region in the first direction;
a source-end doped region, located in the well region;
a gate structure, which is located at the well region, and forms a channel region at a position from the well region to the drift region, wherein a channel direction of the channel region is the first direction of the drift region, the channel region is located between the source-end doped region and the drain-end doped region, and is in contact with the source-end doped region,
wherein, the source-end doped region comprises at least one first doped region and at least one second doped region of opposite doping types, a doping type of the drift region is same with a doping type of the drain-end doped region, a doping type of said at least one first doped region is same with the doping type of the drain-end doped region, said at least one first doped region and said at least one second doped region are linearly distributed in a second direction and alternately connected, wherein the second direction is perpendicular to the first direction on the upper surface of the drift region, and each one of said at least one first doped region is located corresponding to the channel region,
wherein the gate structure comprises at least one trench gate, each of which consists of a first portion and a second portion, the second portion has a sidewall surface in direct contact with the source-end doped region, an entire bottom surface of the first portion is in direct contact with the drift region, an entire bottom surface of the second portion is in direct contact with the well region, and the first portion and the second portion have upper surfaces flush with each other and have a same height,
a bottom surface of the drain-end doped region and a contact surface, facing the drain-end doped region, of each said at least one trench gate, are in direct contact with the drift region.

2. The semiconductor device according to claim 1, wherein
a number of said at least one first doped region is two or more.

3. The semiconductor device according to claim 1, wherein
a channel width of the channel region matches a size of said at least one first doped region.

4. The semiconductor device according to claim 1, wherein a number of said at least one trench gate matches a number of said at least one second doped region.

5. The semiconductor device according to claim 4, wherein the gate structure further comprises:
at least one planar gate, a number of which is matched with the number of said at least one first doped region of a source end, wherein said at least one planar gate covers on the channel region.

6. The semiconductor device according to claim 4, wherein
on a contact surface between the gate structure and the source-end doped region, a pattern of each one of said at least one trench gate extends into a pattern of a corresponding one of said at least one first doped region.

7. The semiconductor device according to claim 6, wherein
on the contact surface between the gate structure and the source-end doped region, a pattern of each one of said at least one second doped region is located in a pattern of a corresponding one of said at least one trench gate, and the pattern of each one of said at least one first doped region is in contact with the pattern of a corresponding one of said at least one second doped region.

8. The semiconductor device according to claim 1, wherein
the doping type of said at least one first doped region is N type, and the doping type of said at least one second doped region is P type.

9. A manufacturing method of a semiconductor device, comprising the semiconductor device according to claim 1, wherein the manufacturing method comprises:
forming the well region on the substrate;
forming the gate structure in the well region and forming a channel region at a position from the well region to the drift region, wherein a channel direction of the channel region is the first direction of the drift region, the channel region is located between the source-end doped region and the drain-end doped region, and is in contact with the source-end doped region;
forming the drain-end doped region on a side of the substrate, wherein the side of the substrate is away from the well region; and
forming the source-end doped region in the well region, wherein the source-end doped region comprises at least one first doped region and at least one second doped region, a side surface of each of said at least one first doped region is in contact with the trench gate structure,
wherein, the step of forming the well region comprise:
forming a well-region trench on the substrate by etching; and forming the well region in the well-region trench by performing epitaxy with well-region material;
wherein, the source-end doped region comprises at least one first doped region and at least one second doped region of opposite doping types, a doping type of the drift region is same with a doping type of the drain-end doped region, a doping type of said at least one first doped region is same with the doping type of the drain-end doped region, said at least one first doped region and said at least one second doped region are linearly distributed in a second direction and alternately connected, wherein the second direction is perpendicular to the first direction on the upper surface of the drift region, and each one of said at least one first doped region is located corresponding to the channel region,
wherein the gate structure comprises at least one trench gate, each of which consists of a first portion and a second portion, the second portion has a sidewall surface in direct contact with the source-end doped region, an entire bottom surface of the first portion is in direct contact with the drift region, an entire bottom surface of the second portion is in direct contact with the well region, and the first portion and the second portion have upper surfaces flush with each other and have a same height, a bottom surface of the drain-end doped region and a contact surface, facing the drain-end doped region, of each said at least one trench gate, are in direct contact with the drift region.

10. The manufacturing method according to claim 9, wherein after forming the well-region trench by etching, the manufacturing method further comprises:

forming an oxide layer on an inner wall of the well-region trench by thermal growth; and removing the oxide layer.

11. The manufacturing method according to claim 9, wherein, the step of forming the well region comprises: forming the well region with uniform impurity concentration by performing a rapid thermal epitaxy process.

12. The manufacturing method according to claim 9, wherein the step of forming the gate structure comprises:

forming a first trench structure and a second trench structure by etching at a side of the well region, wherein the side of the well region is adjacent to said drain-end doped region;

forming a gate oxide layer on inner walls of the first trench structure and the second trench structure;

forming a polysilicon layer on the gate oxide layer, to form a first trench gate and a second trench gate;

forming a gate oxide layer and a polysilicon layer sequentially on a surface of the semiconductor device, which is obtained after forming the first trench gate and the second trench gate; and forming a planar gate on an upper portion between the first trench gate and the second trench gate by etching the gate oxide layer and the polysilicon layer.

13. The manufacturing method according to claim 9, wherein, the drain-end doped region is an N-type doped region, and said at least one second doped region is a P-type doped region.

14. The semiconductor device according to claim 1, wherein each one of said at least one trench gate and each one of said at least one second doped region extend approximately to a same depth in the well region.

15. The semiconductor device according to claim 1, wherein the drift region extends deeper into the semiconductor material region that than the well region.

16. The semiconductor device according to claim 1, wherein for each of said at least one trench gate, the entire bottom surface of the first portion has a smaller area than the entire bottom surface of the second portion.

* * * * *